United States Patent
Chen et al.

(12)

(10) Patent No.: US 12,424,290 B2
(45) Date of Patent: Sep. 23, 2025

(54) NON-VOLATILE MEMORY INCLUDING JUDGMENT MEMORY CELL STRINGS AND OPERATING METHOD THEREOF

(71) Applicant: Winbond Electronics Corp., Taichung (TW)

(72) Inventors: Yu-Cheng Chen, Taichung (TW); Chieh-Yen Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 145 days.

(21) Appl. No.: 18/518,444

(22) Filed: Nov. 23, 2023

(65) Prior Publication Data

US 2024/0221847 A1 Jul. 4, 2024

(30) Foreign Application Priority Data

Dec. 29, 2022 (TW) .................................. 111150627

(51) Int. Cl.
*G11C 16/34* (2006.01)
*G11C 16/10* (2006.01)
*G11C 16/14* (2006.01)

(52) U.S. Cl.
CPC ........ *G11C 16/3445* (2013.01); *G11C 16/102* (2013.01); *G11C 16/14* (2013.01); *G11C 16/3459* (2013.01)

(58) Field of Classification Search
CPC ... G11C 16/3445; G11C 16/102; G11C 16/14; G11C 16/3459; G11C 11/5628; G11C 16/0483; G11C 16/10; G11C 16/16; G11C 16/344; G11C 16/08
See application file for complete search history.

(56) References Cited

U.S. PATENT DOCUMENTS

| 7,668,019 | B2 * | 2/2010 | Byeon ................ G11C 16/3413 365/185.11 |
| 7,835,203 | B2 * | 11/2010 | Hung ................ G11C 16/3454 365/189.12 |
| 9,343,161 | B2 * | 5/2016 | Park .................... G11C 16/0483 |
| 9,390,807 | B2 * | 7/2016 | Lin ....................... G11C 16/107 |
| 9,502,121 | B2 | 11/2016 | Lee et al. |
| 10,998,051 | B2 | 5/2021 | Moon et al. |
| 2005/0276112 | A1 * | 12/2005 | Kido ..................... G11C 16/28 365/185.21 |

(Continued)

*Primary Examiner* — Khamdan N. Alrobaie
(74) *Attorney, Agent, or Firm* — JCIPRNET (57) ABSTRACT

A non-volatile memory and an operating method thereof are provided. The non-volatile memory includes a memory array and a controller. Each main memory cell string, a first judgment memory cell string, and a second judgment memory cell string of the memory array respectively includes a plurality of main memory cells, a plurality of first judgment memory cells and a plurality of second judgment memory cells. During a programming operation, the controller determines, according to a data level of each main memory cell, a data level of the corresponding first judgment memory cell, determines, according to data levels of each first judgment memory cell and its preceding first judgment memory cell, a data level of the corresponding second judgment memory cell, and accordingly determines whether to perform a pre-programming operation during an erasing operation.

18 Claims, 5 Drawing Sheets

(56) References Cited

U.S. PATENT DOCUMENTS

| | | |
|---|---|---|
| 2008/0123436 A1 | 5/2008 | Byeon |
| 2008/0137409 A1* | 6/2008 | Nakamura ............. G11C 16/16 |
| | | 365/185.29 |
| 2012/0044764 A1* | 2/2012 | Nakai .................... G11C 16/14 |
| | | 365/185.11 |
| 2015/0213897 A1* | 7/2015 | Lin ........................ G11C 16/16 |
| | | 365/185.29 |
| 2017/0117056 A1* | 4/2017 | Park ................... G11C 16/3409 |
| 2018/0233184 A1* | 8/2018 | Choi ........................ H03K 3/00 |
| 2022/0215886 A1* | 7/2022 | Lim ....................... G11C 16/28 |

* cited by examiner

FIG. 5

NON-VOLATILE MEMORY INCLUDING JUDGMENT MEMORY CELL STRINGS AND OPERATING METHOD THEREOF

CROSS-REFERENCE TO RELATED APPLICATION

This application claims the priority benefit of Taiwanese application no. 111150627, filed on Dec. 29, 2022. The entirety of the above-mentioned patent application is hereby incorporated by reference herein and made a part of this specification.

BACKGROUND

Technical Field

The invention relates to a memory device and an operating method thereof, and particularly relates to a non-volatile memory including judgment memory cell strings and an operating method thereof.

Description of Related Art

Regarding a typical NAND flash memory, when an erasing operation is performed on memory cells, before applying an initial erasing voltage, a pre-programming operation may be performed on all pages, thereby preventing a problem of shallow erase. Where, a voltage intensity of the pre-programming operation is lower than that of a normal programming operation, and is used to increase a threshold voltage of a memory cell in an erasing state, but does not change the memory cell in the erasing state to a programming state.

However, to perform the pre-programming operation prior to an erasing operation may cause an additional burden on the memory cell. As a result, after multiple programming/erasing cycling, an erasing time increases significantly compared with the situation without the pre-programming operation, which means more damage to the memory cell, resulting in a shorter service life.

In an advanced process, a performance of the programming/erasing cycling is deteriorated due to scaling down of the device. If the conventional method of performing the pre-programming operation on all pages is used, the number of times of programming/erasing cycling that may be performed will be reduced, resulting in shorter service life.

SUMMARY

The invention is directed to a non-volatile memory and an operating method thereof, which are adapted to determine whether memory cells to be erased has only undergone a programming voltage in an isolated state, and decide whether to perform a pre-programming operation accordingly.

The invention provides a non-volatile memory including a memory array and a controller. The memory array includes a plurality of blocks. Each of the blocks includes a plurality of main memory cell strings, a first judgment memory cell string, and a second judgment memory cell string. Each of the main memory cell strings includes a plurality of main memory cells connected in series, the first judgment memory cell string includes a plurality of first judgment memory cells connected in series, and the second judgment memory cell string includes a plurality of second judgment memory cells connected in series. The controller is coupled to the memory array. During a programming operation, the controller determines a data level of the corresponding first judgment memory cell according to a data level of each main memory cell, determines a data level of the corresponding second judgment memory cell according to data levels of each first judgment memory cell and its previous first judgment memory cell. During an erasing operation, the controller determines whether to perform a pre-programming operation according to data levels of the second judgment memory cells.

The invention provides an operating method of a non-volatile memory, which is adapted to the above non-volatile memory. The operating method includes following steps. During a programming operation, a data level of a corresponding first judgment memory cell is determined according to a data level of each main memory cell, and a data level of a corresponding second judgment memory cell is determined according to data levels of each first judgment memory cell and its previous first judgment memory cell. During an erasing operation, it is determined whether to perform a pre-programming operation according to data levels of the second judgment memory cells.

Based on the above descriptions, the non-volatile memory of the invention is adapted to perform the pre-programming operation before erasing data only when it is determined that the memory cells to be erased has only undergone a programming voltage in an isolated state. In this way, the pre-programming operation is performed exactly when it is really needed, which reduces the number of times of the pre-programming operations to reduce damage to the memory cells, improve erase efficiency, increase the number of times of programming/erasing cycling, and thus achieving an effect of extending a service life of the memory cells.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In this invention, when a programming voltage is applied to a word line, and the adjacent word lines on either side are not subjected to the same programming voltage, that specific word line is referred to as an "isolation word line." In other words, the memory cells connected to the isolation word line experience a programming voltage in an isolated state. Regarding a NAND type flash memory, after an erasing operation is performed on a block (or page) of memory cells which have only undergone a programming voltage in an isolated state, the memory cells connected to the isolation word line(s) are more likely to have a problem of shallow erase. To solve problem of shallow erase and prolong a service life of the flash memory, the present invention determines whether memory cells to be erased has only undergone a programming voltage in an isolated state, and decide whether to perform a pre-programming operation accordingly. In particular, the pre-programming operation is only performed when it is determined that the memory cells to be erased has only undergone a programming voltage in an isolated state.

Figure 1:
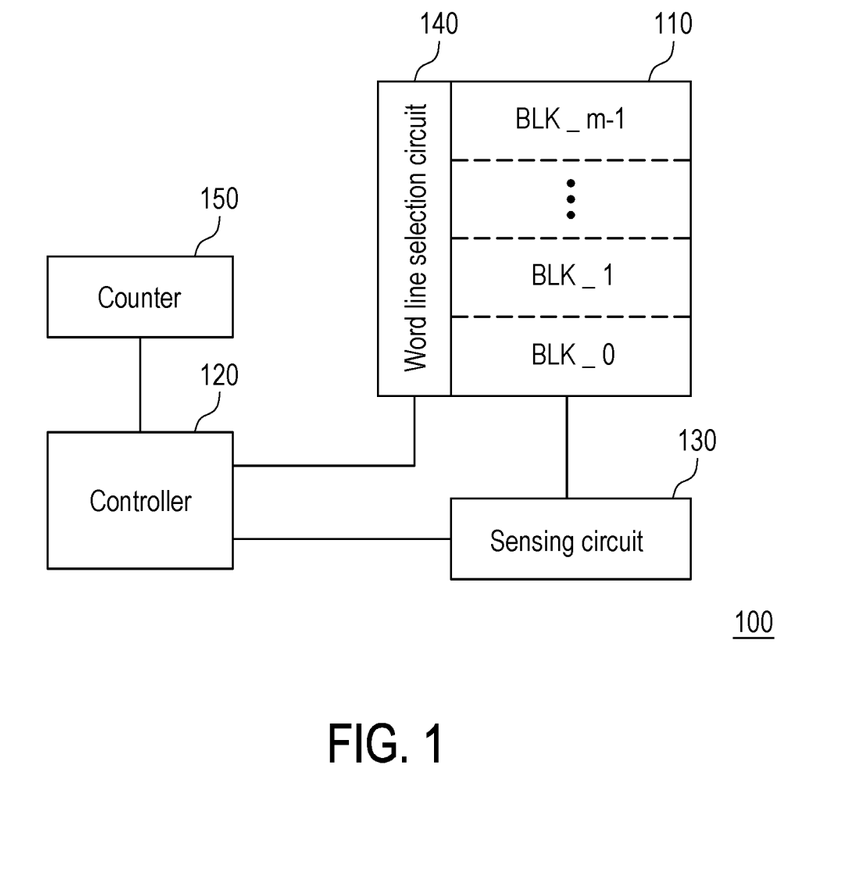
FIG. 1 is a schematic block diagram of a non-volatile memory of an embodiment of the invention.
Figure 2:
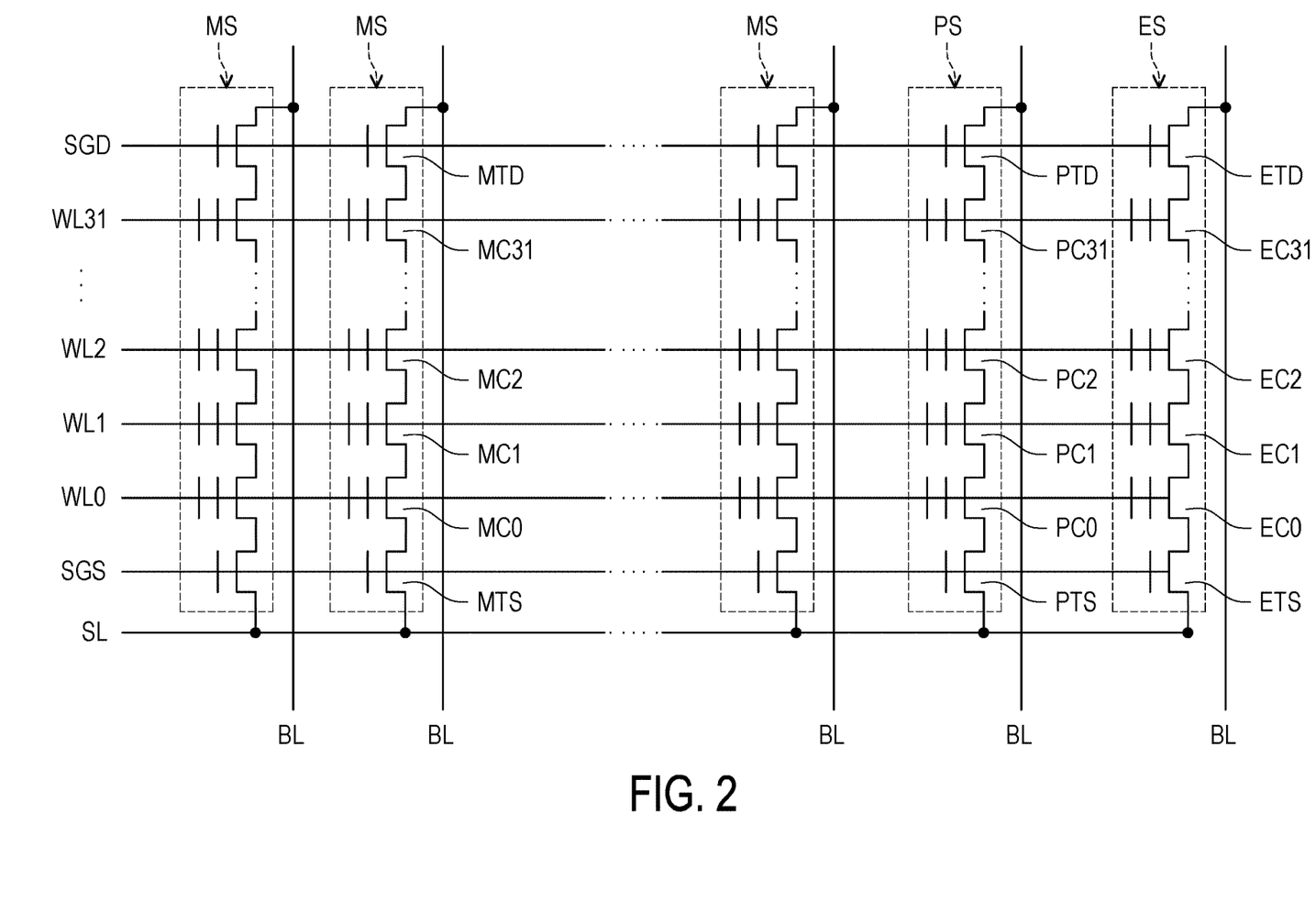
FIG. 2 is a schematic structural diagram of memory cell strings in a block of a memory array according to the embodiment of FIG. 1.

Referring to FIG. 1 and FIG. 2 at the same time, a non-volatile memory 100 of an embodiment of the invention is, for example, a NAND flash memory. The non-volatile memory 100 includes a memory array 110, a controller 120, a sensing circuit 130, a word line selection circuit 140 and a counter 150. The memory array 110 includes m blocks BLK_0-BLK_m−1 arranged along a column direction, m is a positive integer greater than or equal to 1. Each of the blocks BLK_0-BLK_m−1 includes a plurality of main memory cell strings MS, a first judgment memory cell string PS, and a second judgment memory cell string ES.

The memory array 110 is formed by arranging a plurality of memory cells in a matrix. As shown in FIG. 2, each main memory cell string MS includes a plurality of main memory cells MC0-MC31 connected in series, a bit line side selection transistor MTD, and a source line side selection transistor MTS. The first judgment memory cell string PS includes a plurality of first judgment memory cells PC0-PC31 connected in series, a bit line side selection transistor PTD and a source line side selection transistor PTS. The second judgment memory cell string ES includes a plurality of second judgment memory cells EC0-EC31 connected in series, a bit line side selection transistor ETD and a source line side selection transistor ETS.

Gates of the main memory cells MC0-MC31 are respectively connected to word lines WL0-WL31. Gates of the first judgment memory cells PC0-PC31 and gates of the second judgment memory cells EC0-EC31 are also respectively connected to the word lines WL0-WL31. Drains of the bit line side selection transistors MTD, PTD and ETD are respectively connected to the corresponding bit lines BL, and gates of the bit line side selection transistors MTD, PTD and ETD are connected to a selection gate line SGD. Sources of the source line side selection transistors MTS, PTS, ETS are connected to a common source line SL, and gates of the source line side selection transistors MTS, PTS, ETS are connected to selection gate line SGS.

In FIG. 1, the sensing circuit 130 is coupled between the memory array 110 and the controller 120. The sensing circuit 130 may be connected to all of the bit lines BL to read data levels of the main memory cells MC0-MC31, the first judgment memory cells PC0-PC31 and the second judgment memory cells EC0-EC31. The sensing circuit 130 may include, for example, a sensing amplifier and a page buffer, which may be implemented by a framework of an application memory circuit well known to those skilled in the art in the field of integrated circuits, but the invention is not limited thereto.

The word line selection circuit 140 is coupled between the memory array 110 and the controller 120. The word line selection circuit 140 may be used to drive the word lines WL0-WL31 connected to the main memory cells MC0-MC31, the first judgment memory cells PC0-PC31 and the second judgment memory cells EC0-EC31 and the selection gate lines SGD, SGS. The word line selection circuit 140 may drive the main memory cells MC0-MC31, the first judgment memory cells PC0-PC31, and the second judgment memory cells EC0-EC31 through the word lines WL0-WL31 to perform various operations. In addition, the word line selection circuit 140 may drive the bit line side selection transistors MTD, PTD, ETD and the source line side selection transistors MTS, PTS, ETS through the selection gate lines SGD, SGS to select blocks and pages. The word line selection circuit 140 may be implemented by a framework of an application memory circuit well known to those skilled in the art in the field of integrated circuits, but the invention is not limited thereto.

The counter 150 is coupled to the controller 120. The controller 120 may be configured to increment a counting value after erasing verification of an erasing operation is passed. The counting value of the counter 150 may be used to perform pre-programming operations on some of the pages, and details thereof will be described later.

The controller 120 is, for example, a central processing unit (CPU), or other programmable general-purpose or special-purpose microprocessor, digital signal processor (DSP), programmable controller, application specific integrated circuits (ASIC), programmable logic device (PLD) or other similar devices or a combination of these devices. The controller 120 may be coupled to the memory array 110 through the word line selection circuit 140. In the embodiment, during a programming operation, the controller 120 may determine a data level of the corresponding first judgment memory cell (for example, PC1) according to a data level of each main memory cell (for example, MC1). In addition, the controller 120 may determine a data level of the second judgment memory cell (such as EC1) corresponding to each first judgment memory cell (such as PC1) according to the data levels of each first judgment memory cell (such as PC1) and its previous first judgment memory cell (such as PC0).

Specifically, during a programming operation, the controller 120 may program a main memory cell MCn selected from the main memory cells MC0-MC31, and then accordingly program the first judgment memory cell PCn corresponding to the selected main memory cell MCn. In the embodiment, the so-called "corresponding to" refers to a relationship of commonly connecting a same word line, and n is a positive integer greater than or equal to 1 and less than or equal to 31.

Then, the controller 120 may determine whether a previous first judgment memory cell PCn−1 of the first judgment memory cell PCn has a programming level, i.e., determine whether the previous first judgment memory cell PCn−1 has been programmed. In the embodiment, the programming level is, for example, a low logic level (representing a binary value of 0) after the memory cell is programmed.

If the previous first judgment memory cell PCn−1 has the programming level, it means that the corresponding main memory cell MCn−1 has also been programmed. In other words, the word lines WLn and WLn−1 connected to the main memory cells MCn and MCn−1 have been applied with a programming voltage Vpgm, i.e., the selected block of the memory array has at least the word line WLn which is not an isolation word line, therefore the problem of shallow erase in the subsequent erasing operation is not severe. In this case, the controller 120 may also program the second judgment memory cell ECn corresponding to the selected main memory cell MCn and the first judgment memory cell PCn to change it to the programming level for recording.

If the previous first judgment memory cell PCn−1 does not have the programming level, it means that the corresponding main memory cell MCn−1 is not programmed. In other words, only the word line WLn connected to the main memory cell MCn has been applied with the programming voltage Vpgm, while the word line WLn-1 connected to the main memory cell MCn-1 has not been programmed, i.e., the word line WLn is applied with the programming voltage Vpgm in an isolated state, so that the problem of shallow erase is more likely to occur in the subsequent erasing operation. In this case, the controller 120 will not program the second judgment memory cell ECn corresponding to the selected main memory cell MCn and the first judgment memory cell PCn (i.e., a logic value of the second judgment memory cell ECn is "1"). The programming voltage Vpgm is, for example, 15 volts to 20 volts.

Figure 3A:
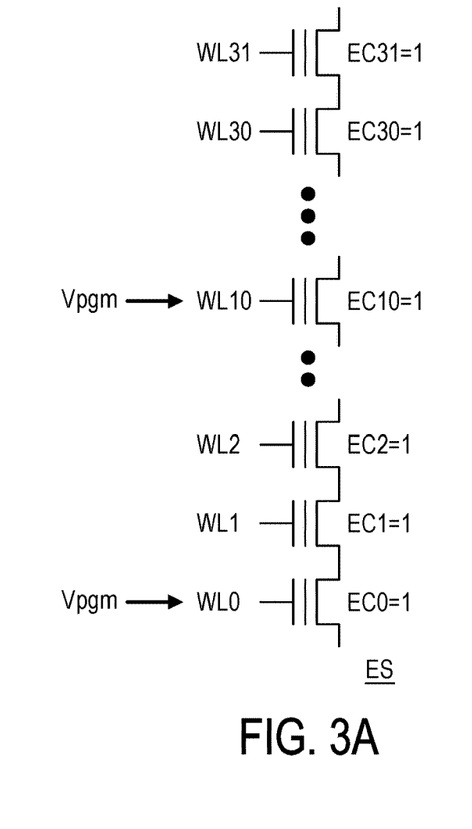
FIG. 3A to FIG. 3C show data levels of second judgment memory cells according to an embodiment of the invention.

The programming operation of the embodiment will be described with reference of specific examples below. FIG. 3A shows data levels of the second judgment memory cells EC0-EC31 after the main memory cells MC0 and MC10 are programmed. In the embodiment, the word lines WL0 and WL10 connected to the main memory cells MC0 and MC10 are applied with the programming voltage Vpgm, so as to program the main memory cells MC0 and MC10 and the first judgement memory cells PC0 and PC10 to logic "0". Since the word line WL0 is a first word line, there is no previous word line, and there is no need to judge the state of the previous word line and the previous first judgment memory cell, i.e., the word line WL0 is an isolation word line, so that the second judgment memory cell EC0 maintains logic "1". Since the previous word line WL9 of the word line WL10 is not applied with the programming voltage Vpgm, the first judgment memory cell PC9 corresponding to the word line WL9 maintains logic "1", i.e., the word line WL10 is an isolation word line, and the second judgment memory cell EC10 still maintains logic "1". In this way, according to a read result of logic "1" from the second judgment memory cell string ES, it may be determined that the memory cells in the selected block of the memory array have only undergone a programming voltage in an isolated state.

Figure 3B:
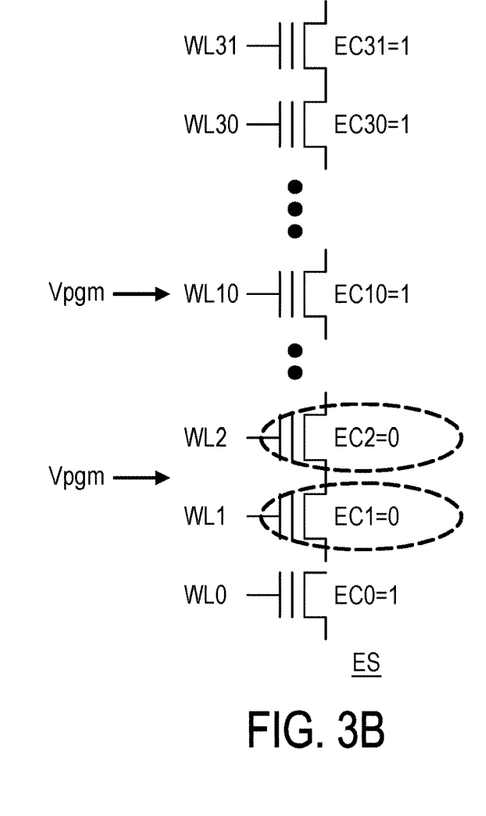

FIG. 3B shows the data levels of the second judgment memory units EC0-EC31 after programming the main memory cells MC0-MC2 and MC10. In the embodiment, the word lines WL0-WL2 and WL10 connected to the main memory cells MC0-MC2 and MC10 are applied with the programming voltage Vpgm to program the main memory cells MC0-MC2 and MC10 and the first judgment memory cells PC0-PC2 and PC10 to logic "0". As mentioned above, since the word line WL0 is the first word line, the second judgment memory unit EC0 maintains logic "1". Since the previous word line WL9 of the word line WL10 is not applied with the programming voltage Vpgm, the first judgment memory cell PC9 corresponding to the word line WL9 maintains logic "1", and the second judgment memory cell EC10 still maintains logic "1".

In addition, since the first judgment memory cell PC0 connected to the previous word line WL0 of the word line WL1 is programmed as the logic "0", the second judgment memory cell EC1 connected to the word line WL1 will also be programmed as the logic "0". Since the first judgment memory cell PC1 connected to the previous word line WL1 of the word line WL2 is programmed as the logic "0", the second judgment memory cell EC2 connected to the word line WL2 will also be programmed as the logic "0". Namely, there is a group of adjacent word lines WL0-WL2 that are all applied with the programming voltage Vpgm in the selected block of the memory array. In this way, according to a read result of logic "0" from the second judgment memory cell string ES, it may be determined that at least one of the memory cells in the selected block of the memory array has undergone a programming voltage in a non-isolated state.

Figure 3C:
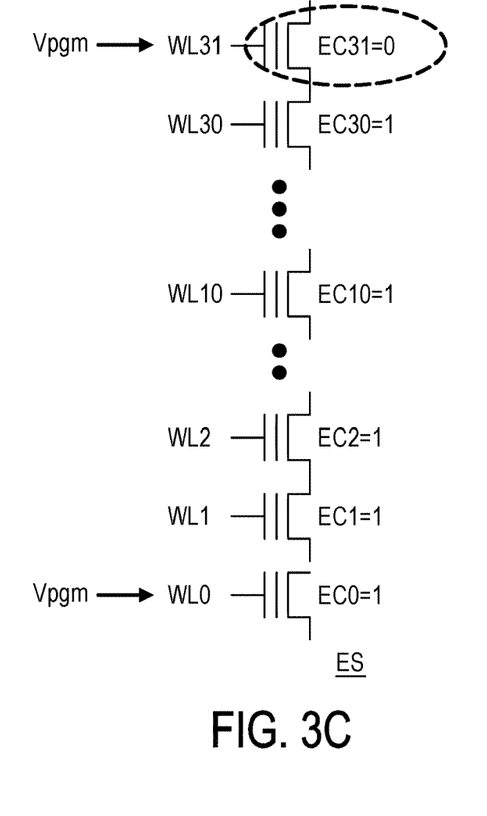

FIG. 3C shows the data levels of the second judgment memory cells EC0-EC31 after programming the main memory cells MC0 and MC30-MC31. In the embodiment, the word lines WL0 and WL30-WL31 connected to the main memory cells MC0 and MC30-MC31 are applied with the programming voltage Vpgm, so that the main memory cells MC0 and MC30-MC31 and the first judgment memory cell PC0 and PC30-PC31 are programmed to logic "0". As mentioned above, since the word line WL0 is the first word line, the second judgment memory unit EC0 maintains logic "1". Since the previous word line WL29 of the word line WL30 is not applied with the programming voltage Vpgm, the first judgment memory cell PC29 corresponding to the word line WL29 maintains logic "1", and the second judgment memory cell EC30 still maintains logic "1".

In addition, since the first judgment memory cell PC30 connected to the previous word line WL30 of the word line WL31 is programmed as the logic "0", the second judgment memory cell EC31 connected to the word line WL31 will also be programmed as the logic "0". Namely, there is a group of adjacent word lines WL30-WL31 that are all applied with the programming voltage Vpgm in the selected block of the memory array, and the second judgment memory cell string ES of such case is regarded to be in the state of logic 0. In this way, according to a read result of logic "0" from the second judgment memory cell string ES, it may be determined that at least one of the memory cells in the selected block of the memory array has undergone a programming voltage in a non-isolated state.

After the above-mentioned programming operation, during the erasing operation, the controller 120 may determine whether to perform a pre-programming operation before applying an erasing voltage according to the data levels of the second judgment memory cells EC0-EC31 (for example, the logic value read from the second judgment memory cell string ES). Specifically, during the erasing operation, the controller 120 may determine whether the second judgment memory cell string ES includes any second judgment memory cell having the programming level through reverse reading. When the second judgment memory cell string ES includes a second judgment memory cell having the programming level (logic "0" is read from the second judgment memory cell string ES), the controller 120 does not perform the pre-programming operation before applying the erasing voltage but directly erases the selected block of the memory array 110. When the second judgment memory cell string ES does not include the second judgment memory cell having the programming level (logic "1" is read from the second judgment memory cell string ES), the controller 120 performs the pre-programming operation on some pages in the selected block of the memory array before applying the erasing voltage, so as to prevent the problem of shallow erase.

It should be noted that during reverse reading, the controller 120 may apply a charging voltage to the source line SL connected to the second judgment memory cell string ES, and apply a test voltage lower than the charging voltage to the word lines WL0-WL31 connected to the second judgment memory cell string ES through the word line selection circuit 140, and turn on the bit line side selection transistor ETD and the source line side selection transistor ETS. Then, the sensing circuit 130 may determine whether an equivalent capacitance of the second judgment memory cell string ES increases in response to the charging voltage.

If yes, it means that the second judgment memory cell string ES is in the state of logic "1". If not, it means that the second judgment memory cell string ES is in the state of logic "0". The charging voltage is, for example, 2.2 volts to 2.4 volts, and the test voltage is, for example, 0.7 volts to 0.9 volts.

Moreover, various voltages required for the reading, programming and erasing operations may be, for example, provided by an internal voltage generating circuit in the non-volatile memory 100.

Regarding the pre-programming operation performed on some pages in an embodiment of the invention, the controller 120 may select some corresponding pages according to the counting value of the counter 150 to perform the pre-programming operation. The counting value of the counter 150 is incremented after the erasing verification of the erasing operation is passed. In this way, the controller 120 may dynamically adjust addresses corresponding to some pages to be performed the pre-programming operation according to a number of times of erase.

For example, when the logic "1" is read from the second judgment memory cell string ES, if the controller 120 determines that the counting value of the counter 150 is 0, it means that a first erasing operation is about to be performed, and the corresponding pre-programming pages are a page 0 to a page 7. After the pre-programming operation is performed on the pages 0 to 7, the first erasing operation is performed on the selected block, and the counting value of the counter 150 is incremented to become 1 after the first erasing operation is completed. In addition, when the erasing operation is performed for the second time, the counting value of the counter 150 is 1. Accordingly, if the logic "1" is read from a second judgment memory cell string ES, the controller 120 performs the pre-programming operation on a page 8 to a page 15. Similarly, when the erasing operation is performed for a third time, the counting value of the counter 150 is 2, and the corresponding pre-programming pages are page 16 to page 23, and so on.

Based on the above, each block of the memory array 110 of the invention includes the first judgment memory cell string PS and the second judgment memory cell string ES, so that it may be determined whether memory cells to be erased has only undergone a programming voltage in an isolated state according to the operation method of the invention. Moreover, during an erase operation, reverse reading is initially used to determine the state of the second judgment memory cell string ES, and the pre-programming operation is only performed when it is determined that the memory cells to be erased has only undergone a programming voltage in an isolated state, thereby mitigate the effect of shallow erase. Moreover, according to the counting value of the counter 150, a page range for performing the pre-programming operation may be adjusted according to the number of times of erase, thereby increasing the number of times of the programming/erasing cycling, and prolonging the service life of the non-volatile memory 100.

Figure 4:
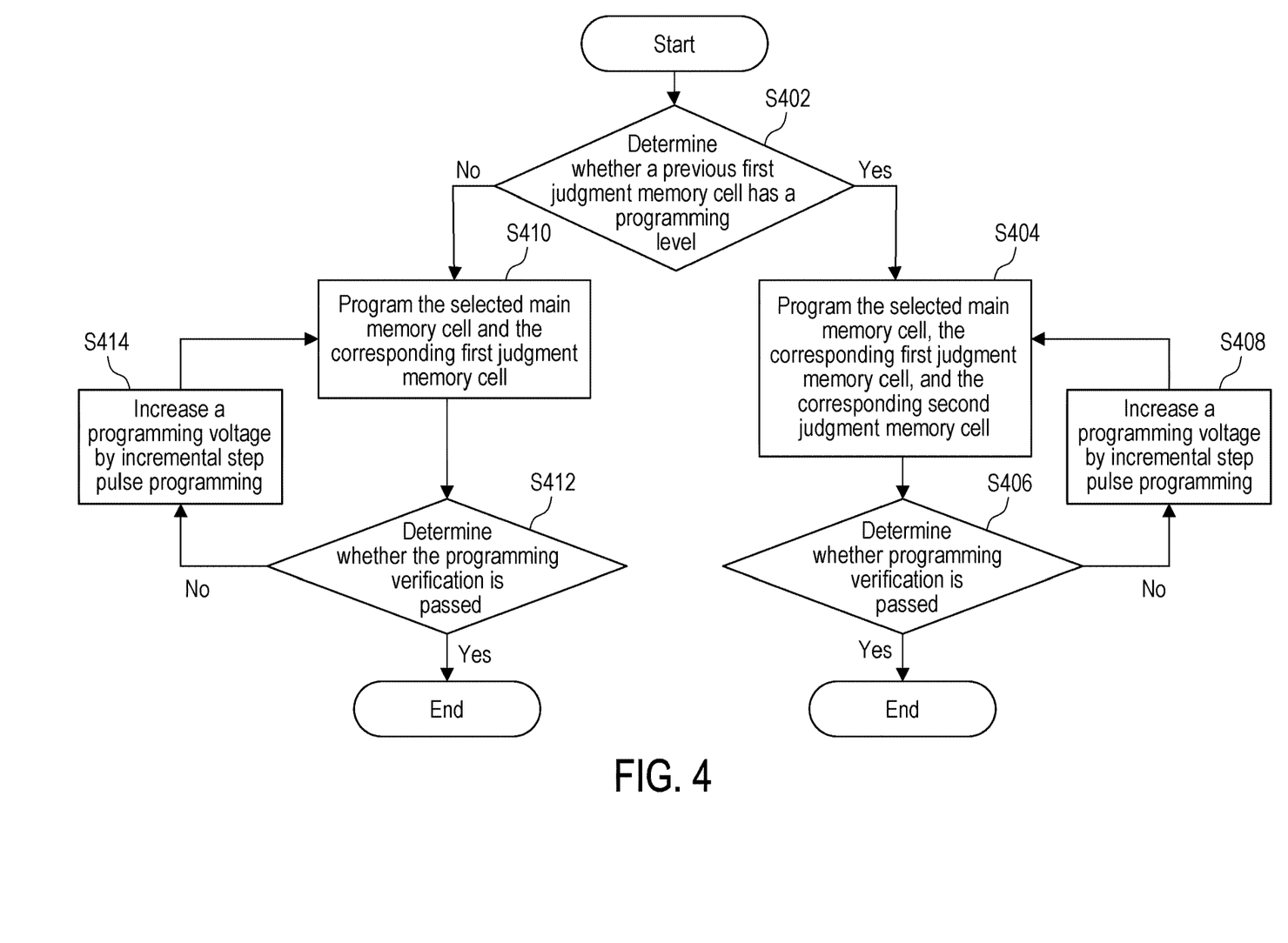
FIG. 4 is a step flowchart of a programming operation of a non-volatile memory according to an embodiment of the invention.

FIG. 4 is a step flowchart of a programming operation of a non-volatile memory according to an embodiment of the invention. The programming operation of the embodiment is adapted to the non-volatile memory 100 shown in FIG. 1, please referring to FIG. 1 and FIG. 4 at the same time.

After the non-volatile memory 100 receives a programming command, in step S402, the controller 120 determines whether the previous first judgment memory cell PCn−1 of the first judgment memory cell PCn corresponding to the selected main memory cell MCn has a programming level. When the previous first judgment memory cell PCn−1 has the programming level, the controller 120 performs programming on the selected main memory cell MCn, the corresponding first judgment memory cell PCn, and the corresponding second judgment memory cell ECn (step S404). Then, in step S406, the controller 120 determines whether programming verification is passed. If yes, the programming operation is ended, and programming of a next page or block may be continued. If not (verification failed), in step S408, the controller 120 increases a programming voltage (for example, by 0.4 volts) by incremental step pulse programming (ISPP), and then returns to step S404 to repeatedly apply an adjusted programming voltage until the programming verification is passed.

When the previous first judgment memory cell PCn−1 does not have the programming level, the controller 120 programs the selected main memory cell MCn and the corresponding first judgment memory cell PCn (step S410). Then, in step S412, the controller 120 determines whether the programming verification is passed. If yes, the programming operation is ended, and programming of the next page or block may be continued. If not, in step S414 the controller 120 increases the programming voltage by ISPP, and then returns to step S410 to repeatedly apply the adjusted programming voltage until the programming verification is passed.

Figure 5:
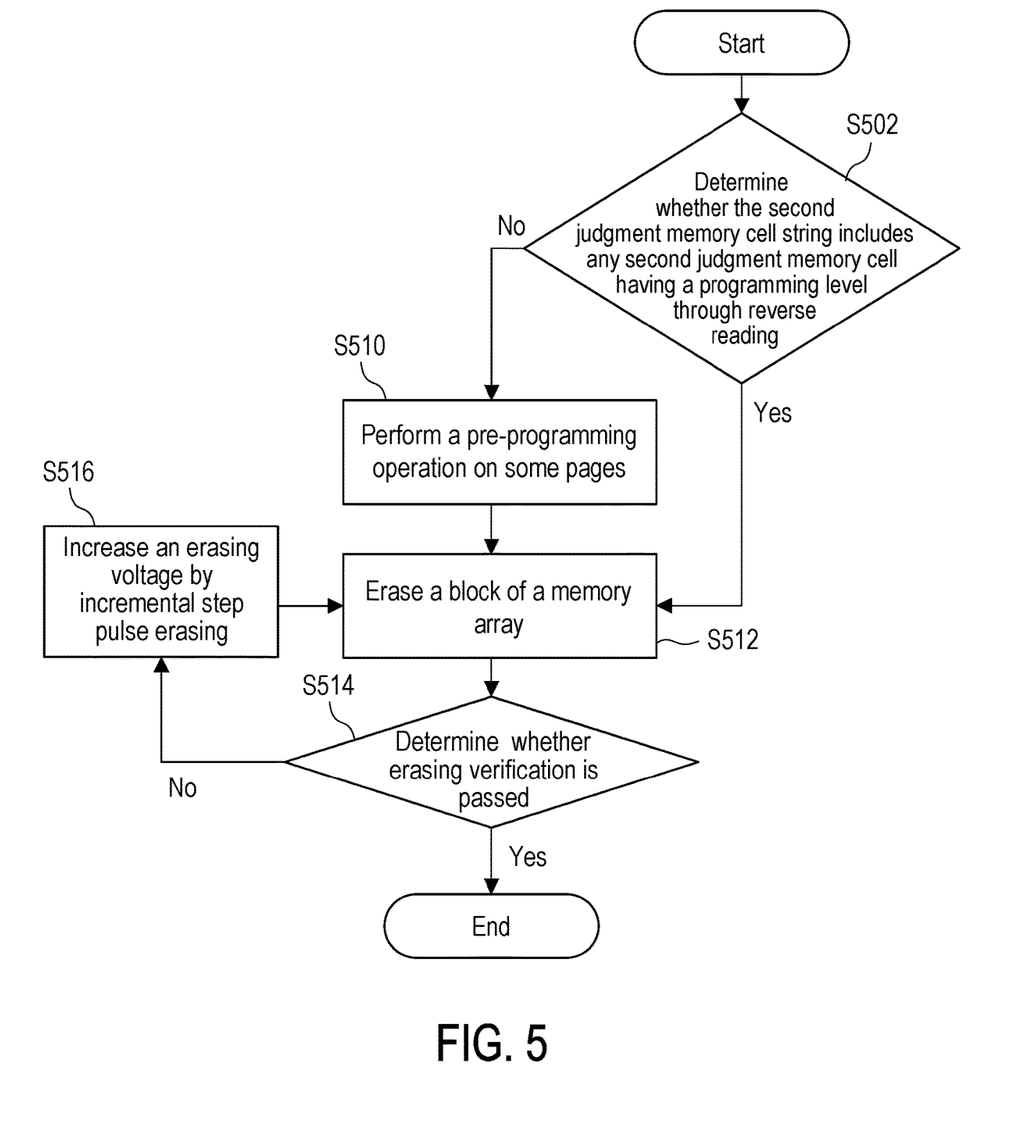
FIG. 5 is a step flowchart of an erasing operation of a non-volatile memory according to an embodiment of the invention.

FIG. 5 is a step flowchart of an erasing operation of a non-volatile memory according to an embodiment of the invention. The erasing operation of the embodiment is adapted to the non-volatile memory 100 shown in FIG. 1, please referring to FIG. 1 and FIG. 5 at the same time.

First, in step S502, the controller 120 determines whether the second judgment memory cell string ES includes any second judgment memory cell having the programming level through reverse reading. When the second judgment memory cell string ES includes a second judgment memory cell with the programming level (the second judgment memory cell string ES is in the state of logic "0"), the controller 120 directly erases the blocks of the memory array 110 (step S512). Then, in step S514, the controller 120 determines whether erasing verification is passed. If yes, the erasing operation is ended, and erasing of a next block may be continued. If not (verification failed), in step S516, the controller 120 increases the erasing voltage by incremental step pulse erasing, and then returns to step S512 to repeatedly apply an adjusted erasing voltage until the erasing verification is passed.

When the second judgment memory cell string ES does not include a second judgment memory cell having the programming level (the second judgment memory cell string ES is in the state of logic "1".), the controller 120 first performs the pre-programming operation on some pages (step S510). Moreover, step S512 is not performed until the pre-programming operation on some pages is completed.

In summary, the non-volatile memory of the invention is adapted to perform the pre-programming operation before erasing only when it is determined that the memory cells to be erased has only undergone a programming voltage in an isolated state. In this way, the pre-programming operation is performed exactly when it is really needed, which reduces the number of times of the pre-programming operations, so as to reduce damage to the memory cells. Meanwhile, the page range for performing the pre-programming operation may be adjusted according to the number of times of erase, that is, the addresses for preforming the pre-programming operation are dynamically changed, thereby increasing the number of times of the programming/erasing cycling, improving reliability of programming/erasing cycling and high-temperature data retention (HTDR), and prolonging the service life of the non-volatile memory 100. Besides, erase efficiency can be improved even the memory cells have experienced a large number of programming/erasing cycling.

The present invention is suitable for making miniaturized non-volatile memory, for example, a NAND flash memory device, so as to increase the total number of dies on a wafer. Therefore, the production cost and energy consumption of manufacturing a single IC are reduced, and the production energy consumption of subsequent packaging is also reduced, thereby reducing carbon emissions in the process of producing non-volatile memory. Besides, since reliability and durability of the non-volatile memory of the present invention are improved, the present invention provides a sustainable non-volatile memory.

Furthermore, the non-volatile memory of the present disclosure may be used on automotive electronics, such as Advanced Driver Assistance Systems (ADAS), Instrument Clusters, Infotainment. The flash memory devices of the present disclosure may be used on space constrained applications including Wearable, MP3 players, smart watches, games, digital radio, toys, cameras, digital photo album, GPS, Bluetooth and WiFi modules. The non-volatile memory of the present disclosure may be used on IoT and mobile electronic devices.

What is claimed is:

1. A non-volatile memory, comprising:
   a memory array, comprising a plurality of blocks, wherein each of the blocks comprises a plurality of main memory cell strings, a first judgment memory cell string, and a second judgment memory cell string, each of the main memory cell strings comprises a plurality of main memory cells connected in series, the first judgment memory cell string comprises a plurality of first judgment memory cells connected in series, and the second judgment memory cell string comprises a plurality of second judgment memory cells connected in series; and
   a controller, coupled to the memory array, wherein during a programming operation, the controller is configured to determine a data level of the corresponding first judgment memory cell according to a data level of each of the main memory cells, and determine a data level of the corresponding second judgment memory cell according to data levels of each of the first judgment memory cells and a respective previous first judgment memory cell,
   wherein during an erasing operation, the controller is configured to determine whether to perform a pre-programming operation according to data levels of the second judgment memory cells.

2. The non-volatile memory according to claim 1, wherein during the erasing operation, the controller determines whether the second judgment memory cell string comprises any of the second judgment memory cells having a programming level through reverse reading, and
   when the second judgment memory cell string comprises the second judgment memory cell having the programming level, the controller does not perform the pre-programming operation before applying an erasing voltage.

3. The non-volatile memory according to claim 2, wherein during the reverse reading, the controller is configured to apply a charging voltage to a source line connected to the second judgment memory cell string, apply a test voltage lower than the charging voltage to a plurality of word lines connected to the second judgment memory cell string, and determine whether an equivalent capacitance of the second judgment memory cell string increases in response to the charging voltage.

4. The non-volatile memory according to claim 2, wherein when the second judgment memory cell string does not comprise the second judgment memory cell having the programming level, the controller performs the pre-programming operation on some pages before applying the erasing voltage.

5. The non-volatile memory according to claim 1, wherein when erasing verification of the erasing operation fails, the controller repeatedly performs erasing by incremental step pulse erasing until the erasing verification is passed.

6. The non-volatile memory according to claim 1, further comprising:
   a counter, coupled to the controller, and configured to increment a counting value after erasing verification of the erasing operation is passed,
   wherein the controller selects some corresponding pages to perform the pre-programming operation according to the counting value.

7. The non-volatile memory according to claim 1, further comprising:
   a sensing circuit, coupled between the memory array and the controller, and configured to read the data levels of the main memory cells, the first judgment memory cells, and the second judgment memory cells.

8. The non-volatile memory according to claim 1, further comprising:
   a word line selection circuit, coupled between the memory array and the controller, and configured to drive a plurality of word lines connected to the main memory cells, the first judgment memory cells, and the second judgment memory cells.

9. The non-volatile memory according to claim 1, wherein during the programming operation, the controller determines whether the previous first judgment memory cell of the first judgment memory cell corresponding to a selected main memory cell has a programming level,
   when the previous first judgment memory cell has the programming level, the controller applies a programming voltage to the selected main memory unit, the corresponding first judgment memory cell, and the corresponding second judgment memory cell, and
   when the previous first judgment memory cell does not have the programming level, the controller applies the programming voltage to the selected main memory unit and the corresponding first judgment memory cell.

10. The non-volatile memory according to claim 9, wherein when programming verification of the programming operation fails, and when the previous first judgment memory cell has the programming level, the controller repeatedly applies an adjusted programming voltage to the selected main memory cell, the corresponding first judgment memory cell, and the corresponding second judgment memory cell by incremental step pulse programming until the programming verification is passed.

11. An operating method of a non-volatile memory, wherein the non-volatile memory comprises a plurality of main memory cell strings, a first judgment memory cell string, and a second judgment memory cell string, each of the main memory unit strings comprises a plurality of main memory cells connected in series, the first judgment memory cell string comprises a plurality of first judgment memory cells connected in series, the second judgment memory cell string comprises a plurality of second judgment memory cells connected in series, and the operating method comprises:

during a programming operation, determining a data level of the corresponding first judgment memory cell according to a data level of each of the main memory cells, and determining a data level of the corresponding second judgment memory cell according to data levels of each of the first judgment memory cells and a respective previous first judgment memory cell; and during an erasing operation, determining whether to perform a pre-programming operation according to data levels of the second judgment memory cells.

12. The operating method according to claim 11, wherein the step of determining whether to perform the pre-programming operation according to the data levels of the second judgment memory cells comprises:

during the erasing operation, determining whether the second judgment memory cell string comprises any of the second judgment memory cells having a programming level through reverse reading; and not performing the pre-programming operation before applying an erasing voltage when the second judgment memory cell string comprises the second judgment memory cell having the programming level.

13. The operating method according to claim 12, wherein the step of determining whether the second judgment memory cell string comprises any of the second judgment memory cells having the programming level through reverse reading comprises:

applying a charging voltage to a source line connected to the second judgment memory cell string, and applying a test voltage lower than the charging voltage to a plurality of word lines connected to the second judgment memory cell string; and determining whether an equivalent capacitance of the second judgment memory cell string increases in response to the charging voltage.

14. The operating method according to claim 12, wherein the step of determining whether to perform the pre-programming operation according to the data levels of the second judgment memory cells comprises:

performing the pre-programming operation on some pages before applying the erasing voltage when the second judgment memory cell string does not comprise the second judgment memory cell having the programming level.

15. The operating method according to claim 11, further comprising:

when erasing verification of the erasing operation fails, repeatedly performing erasing by incremental step pulse erasing until the erasing verification is passed.

16. The operating method according to claim 11, further comprising:

incrementing a counting value after erasing verification of the erasing operation is passed; and selecting some corresponding pages to perform the pre-programming operation according to the counting value.

17. The operating method according to claim 11, wherein the step of determining the data level of the corresponding second judgment memory cell according to the data levels of each of the first judgment memory cells and the respective previous first judgment memory cell comprises:

during the programming operation, determining whether the previous first judgment memory cell of the first judgment memory cell corresponding to a selected main memory cell has a programming level;

applying a programming voltage to the selected main memory unit, the corresponding first judgment memory cell, and the corresponding second judgment memory cell when the previous first judgment memory cell has the programming level; and applying the programming voltage to the selected main memory unit and the corresponding first judgment memory cell when the previous first judgment memory cell does not have the programming level.

18. The operating method according to claim 17, further comprising:

when programming verification of the programming operation fails, and when the previous first judgment memory cell has the programming level, repeatedly applying an adjusted programming voltage to the selected main memory cell, the corresponding first judgment memory cell, and the corresponding second judgment memory cell by incremental step pulse programming until the programming verification is passed.

\* \* \* \* \*